United States Patent
De Los Santos et al.

(10) Patent No.: US 6,548,375 B1
(45) Date of Patent: *Apr. 15, 2003

(54) METHOD OF PREPARING SILICON-ON-INSULATOR SUBSTRATES PARTICULARLY SUITED FOR MICROWAVE APPLICATIONS

(75) Inventors: Héctor J. De Los Santos, Del Aire, CA (US); Yu-Hua Kao Lin, Oak Park, CA (US)

(73) Assignee: Hughes Electronics Corporation, El Segundo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 11 days.

(21) Appl. No.: 09/527,095

(22) Filed: Mar. 16, 2000

(51) Int. Cl.$^7$ .......................... H01L 21/30; H01L 21/46
(52) U.S. Cl. ....................................... 438/455; 438/406
(58) Field of Search ................. 438/455, 311, 438/406, 458, 459

(56) References Cited

U.S. PATENT DOCUMENTS

| | | | |
|---|---|---|---|
| 5,270,221 A | * 12/1993 | Garcia et al. | 438/67 |
| 5,441,803 A | * 8/1995 | Meissner | 428/220 |
| 5,476,813 A | * 12/1995 | Naruse | 438/311 |
| 5,953,620 A | * 9/1999 | Katou et al. | 438/406 |
| 6,063,686 A | * 5/2000 | Masuda et al. | 438/406 |
| 6,091,112 A | * 7/2000 | Kwon | 257/347 |
| 6,136,667 A | * 10/2000 | Hui et al. | 438/459 |
| 6,140,210 A | * 10/2000 | Aga et al. | 438/458 |

FOREIGN PATENT DOCUMENTS

| WO | WO 9905073 | * 2/1999 |
|---|---|---|

OTHER PUBLICATIONS

Imthun et al., "Bonded Silicon–on–Sapphire Wafers and Devices", J. Appl. Phys., 72 (6), p 2526, 1992.*
Wang et al., "N–Channel Metal–Oxide–Semiconductor Transistors Fabricated in a Silcon Film Bonde Onto Sapphire", Appl. Phys. Lett., 64 (6), p 724, 1994.*
Hurley et al., "Some Recent Advances in Silicon Microtechnology and Their Dependence on processing Technique", Vacuum, 46 (3), p 287, 1995.*
Kopperschmidt et al., "High Bond Energy and Thermomechanical Stress in Silicon on Sapphire Wafer Bonding", Appl. Phys. Lett, 70 (22), p 2972, 1997.*
Hasima, J., "Direct Bonding in patent Literature", Philips J. Res. 49, p 165, 1995.*
Gui et al., "Nanomechanical Optical Devices Fabricated with Aligned Wafer Bonding", Micro Electro Mechanical Systems, 1998. MEMS 98. Proceedings., The Eleventh Annual International Workshop pp.: 482–487, 1998.*
Schmidt, M., "Wafe–to–Wafer Bonding for Microstructure Formation", Proceedings of the IEEE, 86 (8), p 1575, 1998.*

(List continued on next page.)

*Primary Examiner*—Kamand Cuneo
*Assistant Examiner*—Asok Kumar Sarkar
(74) *Attorney, Agent, or Firm*—Terje Gudmestad

(57) ABSTRACT

A method of directly and indirectly bonding a microwave substrate 14 and a silicon substrate 12 is described. The method for directly bonding a silicon substrate includes the steps of cleaning the microwave substrate and cleaning the silicon substrate. Then, the microwave substrate and the silicon substrate are stacked together. The stack is placed in a furnace. The temperature of the furnace is increased to a predetermined temperature at a predetermined rate. The temperature of the furnace is reduced at a second predetermined rate. The method of indirectly bonding includes sputtering a silicon dioxide layer on the microwave substrate and silicon substrate prior to placing them together.

15 Claims, 1 Drawing Sheet

OTHER PUBLICATIONS

Gosele et al., "Wafer Bonding: A Flexible Approach to Materials Integration", 11 th Intl. Conf. On Indium Phosphide and Related materials, p 231, 1999.*

Mehra et al., "Microfabrication of High Temperature Silicon Devices using WaferBonding and Deep Reactive Ion Etching", IEEE Journal of Microelectromechanical Systems, 8 (2), p 152, 1999.*

Blackstone, S., "Recent Advances in Wafer Bonding of Silicon and Alternative Materials", Microelectronic Engineering, 48, p 313, 1999.*

* cited by examiner

METHOD OF PREPARING SILICON-ON-INSULATOR SUBSTRATES PARTICULARLY SUITED FOR MICROWAVE APPLICATIONS

TECHNICAL FIELD

The present invention relates generally to microwave substrates, and more particularly, to a method for bonding microwave substrates and silicon substrates that leverages silicon integrated circuit fabrication and silicon micromachining technologies.

BACKGROUND OF THE INVENTION

Microwave communication devices such as satellites employ hybrid microwave circuits such as switching matrices and phased array antennas.

The microwave circuits can include miniature electromechanical (MEM) switches. Commonly, silicon-on-insulator techniques are used in integrated circuits. One method for forming silicon-on-insulator substrates is by the implantation of oxygen ions into a silicon wafer. In this process, oxygen ions are injected deep into the silicon wafer and the wafer is annealed under high temperature to form the buried $SiO_2$ layer. Another method for forming silicon-on-insulator devices uses a first silicon wafer onto which the desired structures are etched. Then, in a post processing step, a second silicon wafer is bonded to the first wafer to enclose the structures. This post processing technique adds to the cost of the devices.

Another method for silicon-on-insulator bonding for two silicon wafers is to use a silicon dioxide bond between two silicon layers. Silicon dioxide is used to bond the two silicon wafers together.

One drawback to the above mentioned silicon-on-insulator methods is that they are intended for the high volume integrated circuit industry. The silicon-on-insulator wafers are extremely pure and thus very expensive. However, because MEMS technology has been highly developed, the cost of processing circuits using this technology is reduced.

It is commonly thought, however, that silicon-based MEMS fabrication processes are not amenable to the fabrication of microwave devices. Silicon has poor microwave properties and thus it was previously thought that the silicon substrate must be removed. Such devices are flip chip bonded to an insulating device where the silicon substrate can then be etched away. This adds to processing steps and increases the cost of the device.

SUMMARY OF THE INVENTION

The present invention therefore provides a methods for bonding a silicon substrate to a microwave substrate that will enable the use of mature silicon MEMS fabrication technology.

The present invention provides two alternative techniques to bonding silicon with a microwave substrate. The first method is a direct fusion bonding method wherein silicon is directly bonded with a microwave substrate. In the second method, an $SiO_2$ layer is deposited on the silicon and microwave substrate and the bond is formed between the two $SiO_2$ layers.

In one aspect of the invention, the direct fusion technique includes the steps of:

cleaning the microwave substrate;

cleaning the silicon substrate;

stacking the microwave substrate and the silicon substrate together to form a stack;

placing the stack in a furnace;

increasing the temperature of the furnace to a predetermined temperature at a predetermined rate; and decreasing the temperature of the furnace to at a second predetermined rate.

In the indirect method, prior to the steps of stacking the microwave substrate and the silicon substrate, an $SiO_2$ layer is sputtered onto the silicon layer and the microwave substrate.

One advantage of the invention is that the present invention enables the fabrication of low insertion loss microwave circuits and MEMS devices on silicon-based technology. The present invention also alleviates the need for post processing of the silicon wafers after MEMS processing.

Other objects and features of the present invention will become apparent when viewed in light of the detailed description of the preferred embodiment when taken in conjunction with the attached drawings and appended claims.

DETAILED DESCRIPTION OF THE PREFERRED EMBODIMENT

Figure 1:
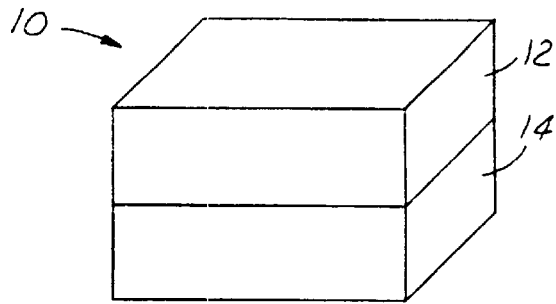
FIG. 1 is a perspective view of a silicon substrate directly bonded to a microwave substrate.

Referring now to FIG. 1, an assembly 10 having a silicon substrate 12 directly bonded to a microwave substrate 14 as illustrated. Silicon substrate 12 may be less pure than that commonly used in the integrated circuit industry since the present application is intended for microwave circuits. Microwave substrate 14 is preferably an alumina ($Al_2O_3$). However, other microwave substrates such as quartz may also be used.

Figure 2:
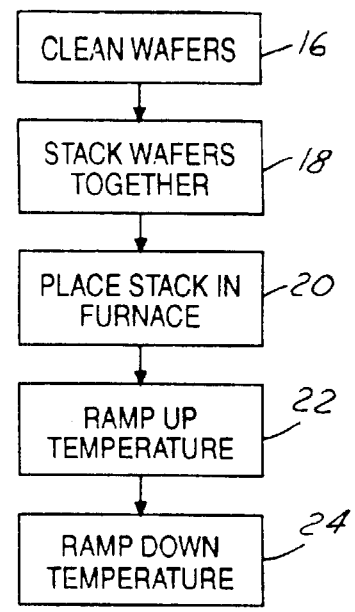
FIG. 2 is a flow chart of a process used to form the silicon and microwave substrate assembly of FIG. 1.

Referring now to FIG. 2, a method for direct fusion bonding of silicon substrate 12 to microwave substrate 14 is illustrated. In step 16, the silicon substrate 12 and microwave substrate 14 are cleaned. The process is described with respect to an alumina microwave substrate. The preferred method for cleaning the alumina substrate is hereinafter described. The substrate is preferably immersed in a cleaner such as Burmar 922 cleaner at 60 to 95 C. for three to five minutes. The alumina substrate is then removed and rinsed in hot tap water for five minutes. The substrate is then rinsed in cold tap water for five minutes. Thereafter, the alumina substrate is rinsed in deionized water for five minutes. Then, the alumina substrate is immersed in clean acetone for one minute and rinsed in deionized water again for five minutes. The alumina is soaked in isopropyl alcohol for one minute and then rinsed in deionized water again for five minutes. Finally, the alumina substrate may be dried by blow drying the substrate with nitrogen gas. Although the above process is specific with respect to times and temperatures, these times and temperatures are not meant to be limiting since those of ordinary skill in the art would recognize that variations in times and temperatures and materials may exist.

The silicon substrate 12 should be cleaned for both inorganic contamination and organic contamination. It is important that the instruments and beakers for cleaning the silicon are clean as well. For cleaning a beaker, preferably a mixture of nitric and sulfuric acid are used for about five minutes. The beaker is then rinsed in deionized water. If tweezers or other instruments are used it is preferred that they are cleaned in acetone in an ultrasonic cleaner then cleaned in methanol in an ultrasonic cleaner.

To clean the surface of the silicon substrate, a cotton swab in acetone is wiped on the surface for five minutes. The silicon wafer is then soaked in acetone for ten minutes and rinsed in deionized water for four minutes. Then, the silicon substrate is placed in methanol at 40 C. for about ten minutes and placed in a deionized water flow for four minutes. The silicon wafer is then blow dried with nitrogen.

To remove inorganic material from the surface of the wafer, a water/hydrochloric acid/hydrogen peroxide mixture in the ratio of 5:1:1 at 70 degrees C. is used to soak the wafer for about ten minutes. The silicon wafer is then placed in a deionized water flow for about four minutes. The silicon wafer is then placed in a water and hydrofluoric acid mixture dip for about 15 seconds. The water/hydrofluoric acid mixture ratio is about 50:1. After the water/hydrofluoric acid mix, the silicon wafer is then placed in a deionized water flow for about four minutes. The silicon wafer is then placed in a water/hydrogen peroxide/ammonium hydroxide solution at 70 degrees C. The ratio of water/hydrogen peroxide/ammonium hydroxide solution is 5:1:1. Preferably, the silicon wafer is placed in the bath for about ten minutes. After the ten minutes, the silicon wafer is placed in a deionized water flow for about four minutes. Thereafter, the silicon wafer is blow dried with nitrogen.

In step 18, the clean silicon substrate and microwave substrate are placed together face to face prior to bonding.

In step 20, the stack is placed into a furnace. Preferably, the furnace is purged with nitrogen gas. In one method performed according to the present invention, nitrogen at a rate of 10 cubic feet per hour was introduced into the furnace for 20 minutes.

The temperature of the nitrogen atmosphere furnace is ramped up at a predetermined rate. In one performed method the heat treatment was performed for 12 hours. The maximum temperature achieved was 1200 degrees C. and was achieved at a ramp up rate of 1 degree C. per minute.

In step 24, the temperature is ramped down to ambient temperature at the same rate of 1 degree C. per minute.

During the heat treating process, the silicon substrate becomes bonded to the microwave substrate by direct fusion bonding. That is, the silicon substrate and microwave substrate become one layer due to migration of molecules.

Figure 3:
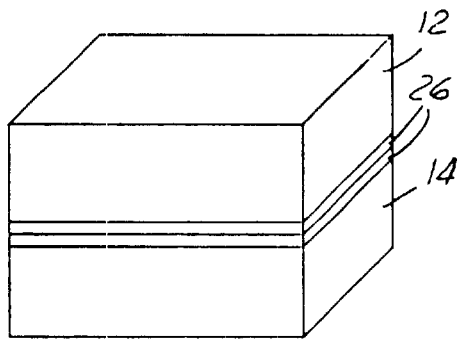
FIG. 3 is a silicon substrate indirectly bonded to a microwave substrate through layers of $SiO_2$.

Referring now to FIG. 3, an assembly 10 having a silicon substrate 12 and a microwave substrate 14 is illustrated. In this example, a layer 26 of $SiO_2$ is sputtered upon silicon substrate 12 and microwave substrate 14 before placing them together. This process forms an indirect bond between silicon substrate 12 and microwave substrate 14.

Figure 4:
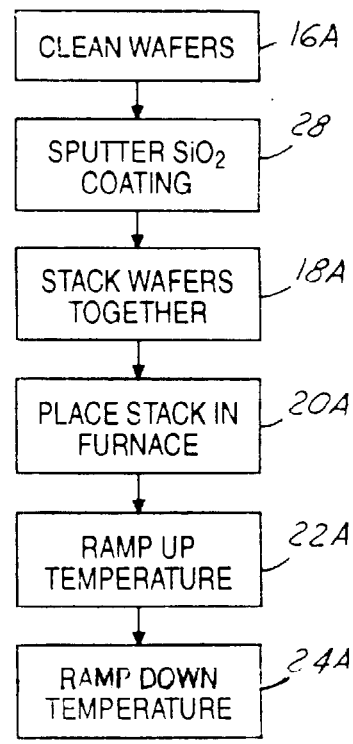
FIG. 4 is a flow chart of a process for forming the silicon and microwave substrate assembly of FIG. 3.

Referring now to FIG. 4, each of the steps of the process illustrated in FIG. 4 is similar to that in FIG. 3 with the addition of step 28. Therefore, the similar steps are designated with an "A" thereafter.

In step 16A, the wafers are preferably cleaned with the same process described in step 16 above.

In step 28, a layer of $SiO_2$ is sputtered upon silicon substrate 12 and microwave substrate 14. The $SiO_2$ may, for example, be about 6000 Å. The wafers with the $SiO_2$ layer are placed together so their $SiO_2$ layers are in contact in step 18A. In step 20A, 22A and 24A, the stack is thus heated in a furnace as in steps 22 and 24. Preferably, the same ramping rate temperature and time are used.

After the assembly is formed according to the processes shown in FIGS. 2 and 4, the assembly is subjected to microelectromechanical fabrication processes. In such processes, the silicon does not have to be removed. The devices formed may be used for a variety of microwave applications such as switching devices.

While particular embodiments of the invention have been shown and described, numerous variations and alternate embodiments will occur to those skilled in the art. Accordingly, it is intended that the invention be limited only in terms of the appended claims.

What is claimed is:

1. A method of bonding a microwave substrate to a silicon substrate comprises the steps of:

cleaning the microwave substrate;

cleaning the silicon substrate;

stacking the microwave substrate and the silicon substrate together to form a stack;

placing the stack in a furnace;

increasing the temperature of the furnace to about 1200 degrees C. with the stack therein to a predetermined temperature at a first predetermined rate of about 1 degree C. per minute; and decreasing the temperature of the furnace with the stack therein to at a second predetermined rate of about 1 degree C. per minute.

2. A method as recited in claim 1 wherein the step of cleaning the microwave substrate comprises the steps of:

immersing the microwave substrate in a substrate cleaner; and rinsing the microwave substrate in water.

3. A method as recited in claim 1 further comprising the steps of drying the substrate with nitrogen gas.

4. A method as recited in claim 1 wherein the step of cleaning the microwave substrate comprises the steps of:

immersing the microwave substrate in acetone; and rinsing the microwave substrate.

5. A method as recited in claim 1 wherein the step of cleaning the microwave substrate comprises the steps of:

immersing the microwave substrate in isopropyl alcohol; and rinsing the microwave substrate.

6. A method as recited in claim 1 further comprising the step of purging the furnace with nitrogen.

7. A method as recited in claim 1 wherein the step of cleaning the silicon substrate comprises the steps of:

removing organic contamination from the silicon substrate; and removing inorganic contamination from the silicon substrate.

8. A method as recited in claim 7 wherein the step of removing organic contamination form the substrate comprises the steps of:

cleaning the silicon substrate in acetone;

rinsing the substrate in water;

cleaning the silicon substrate in methanol; and rinsing the substrate in water.

9. A method as recited in claim 7 wherein the step of removing inorganic contamination from the silicon substrate comprises:

cleaning the silicon substrate in a hydrochloric acid/ hydrogen peroxide mixture;

rinsing the silicon substrate in water;

cleaning the silicon substrate in hydrofluoric acid;

rinsing the silicon substrate in water;

cleaning the silicon substrate in a hydrogen peroxide/ ammonium hydroxide mixture; and rinsing the silicon substrate in water.

10. A method as recited in claim 1 further comprising the steps of sputtering a $SiO_2$ coating on said microwave substrate prior to the step of stacking.

11. A method as recited in claim 1 further comprising the steps of sputtering a $SiO_2$ coating on said silicon substrate prior to the step of stacking.

12. A method as recited in claim 1 wherein the microwave substrate comprises alumina.

13. A method of forming a microwave circuit assembly comprising:

bonding a silicon substrate to a microwave substrate to form an assembly by heat-treating the silicon substrate and the microwave substrate, wherein heat treating comprises;

stacking the microwave substrate and the silicon substrate together to form a stack;

placing the stack in a furnace;

increasing the temperature of the furnace to about 1200 degrees C. with the stack therein to a predetermined temperature at a first predetermined rate of about 1 degree C. per minute; and decreasing the temperature of the furnace with the stack therein to at a second predetermined rate of about 1 degree C. per minute; and micromachining the assembly.

14. A method as recited in claim 13 wherein prior to the step of heat treating performing the steps of:

cleaning the microwave substrate; and cleaning the silicon substrate.

15. A method of bonding an alumina substrate to a silicon substrate comprises the steps of:

cleaning the alumina substrate;

cleaning the silicon substrate;

stacking the alumina substrate and the silicon substrate together to form a stack;

placing the stack in a furnace;

increasing the temperature of the furnace to about 1200 degrees C. with the stack therein to about 1200 degrees C. at a predetermined rate of about 1 degree C. per minute; and decreasing the temperature of the furnace with the stack therein to a second predetermined rate of about 1 degree C. per minute.

\* \* \* \* \*